(12) United States Patent
Kim et al.

(10) Patent No.: US 11,568,911 B2
(45) Date of Patent: Jan. 31, 2023

(54) HIGH-RELIABILITY MAGNETIC MEMORY SYSTEM AND METHOD OF OPERATING THE SAME

(71) Applicant: IUCF-HYU (INDUSTRY-UNIVERSITY COOPERATION FOUNDATION HANYANG UNIVERSITY), Seoul (KR)

(72) Inventors: Taewhan Kim, Seoul (KR); Woo Seong Chung, Namhae-gun (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 17/327,930

(22) Filed: May 24, 2021

(65) Prior Publication Data
US 2022/0139436 A1    May 5, 2022

(30) Foreign Application Priority Data
Oct. 30, 2020   (KR) .................. 10-2020-0143255

(51) Int. Cl.
G11C 11/16    (2006.01)

(52) U.S. Cl.
CPC ...... *G11C 11/1659* (2013.01); *G11C 11/1675* (2013.01)

(58) Field of Classification Search
CPC ............ G11C 11/1659; G11C 11/1675; G11C 2207/2245; G11C 7/04; G11C 11/5607; G06F 12/0897

USPC .................................................. 365/158, 173
See application file for complete search history.

(56) References Cited

U.S. PATENT DOCUMENTS

| | | | |
|---|---|---|---|
| 6,834,010 B1 | 12/2004 | Qi et al. | |
| 2002/0145902 A1* | 10/2002 | Kunikiyo | B82Y 10/00 365/97 |
| 2003/0123199 A1* | 7/2003 | Honda | G11C 8/12 360/324.2 |

(Continued)

FOREIGN PATENT DOCUMENTS

| | | |
|---|---|---|
| KR | 10-2017-0086390 A | 7/2017 |
| KR | 10-2020-0012445 A | 2/2020 |

OTHER PUBLICATIONS

Elham Cheshmikhani et al., "TA-LRW: A Replacement Policy for Error Rate Reduction in STT-MRAM Caches", IEEE Transactions on Computers, Mar. 2019, pp. 455-470, vol. 68, No. 3.

*Primary Examiner* — Michael T Tran
(74) *Attorney, Agent, or Firm* — Sughrue Mion, PLLC

(57) ABSTRACT

Provided is a method of operating a magnetic memory system. The method of operating the magnetic memory system includes: preparing a plurality of magnetic memory cells; classifying the magnetic memory cells into a plurality of magnetic memory cell groups by using program current values of the magnetic memory cells; constructing a magnetic memory system by hierarchizing the magnetic memory cell groups; and primarily performing programming by selecting one magnetic memory cell group from the hierarchized magnetic memory cell groups according to an external temperature.

16 Claims, 14 Drawing Sheets
(1 of 14 Drawing Sheet(s) Filed in Color)

(56) References Cited

U.S. PATENT DOCUMENTS

| | | | |
|---|---|---|---|
| 2005/0231855 A1* | 10/2005 | Tran | G01N 27/122 |
| | | | 360/324.1 |
| 2013/0176773 A1* | 7/2013 | Yuh | G11C 11/1673 |
| | | | 365/158 |
| 2017/0018308 A1* | 1/2017 | Ghosh | G11C 11/1675 |
| 2018/0217117 A1* | 8/2018 | Tran | H01L 45/16 |
| 2020/0202938 A1* | 6/2020 | Reina | G11C 16/349 |
| 2020/0392283 A1* | 12/2020 | Fan | C08G 59/24 |

* cited by examiner

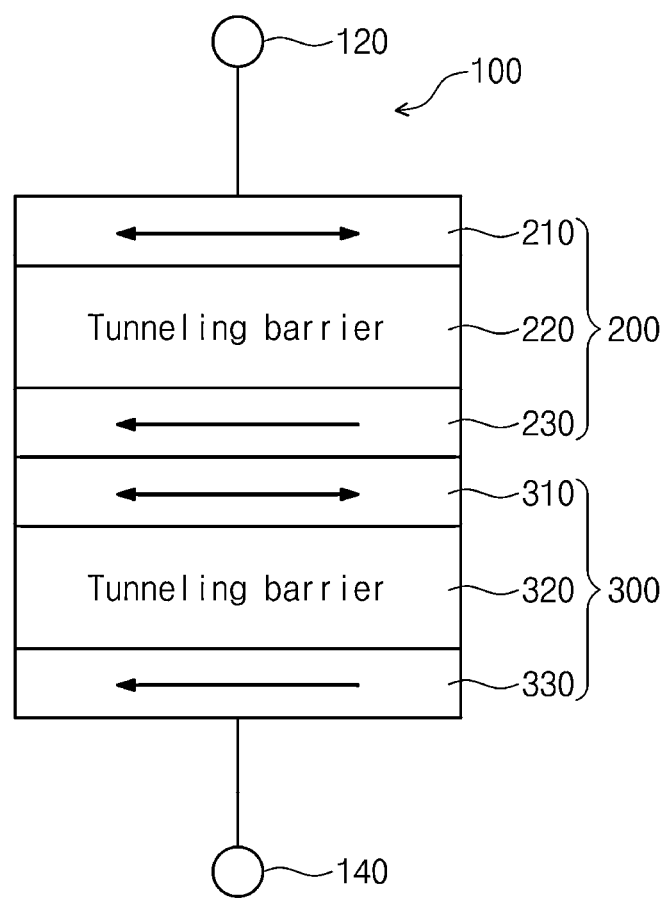
[FIG.1]

[FIG.2]
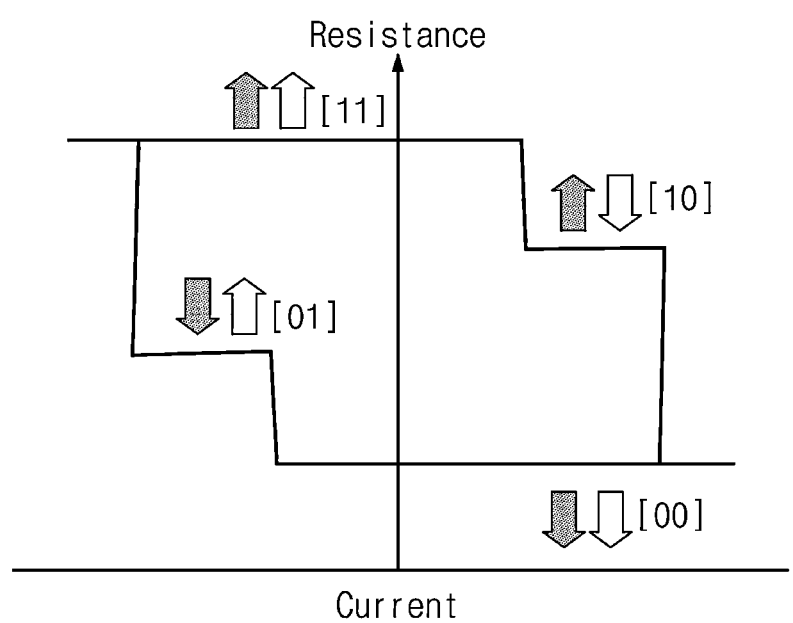

[FIG.3]
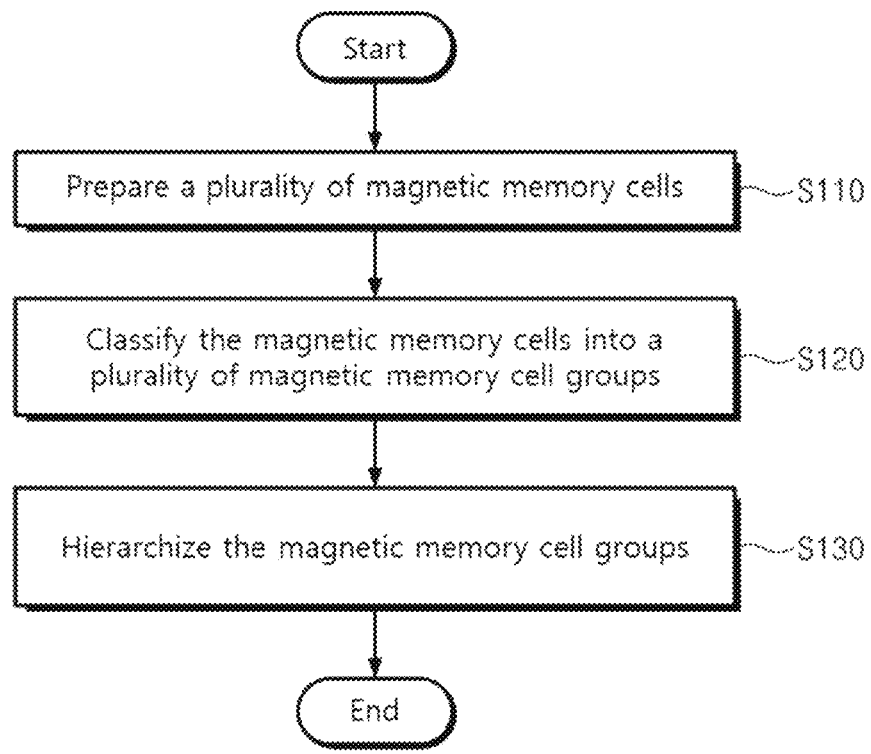

[FIG.4]
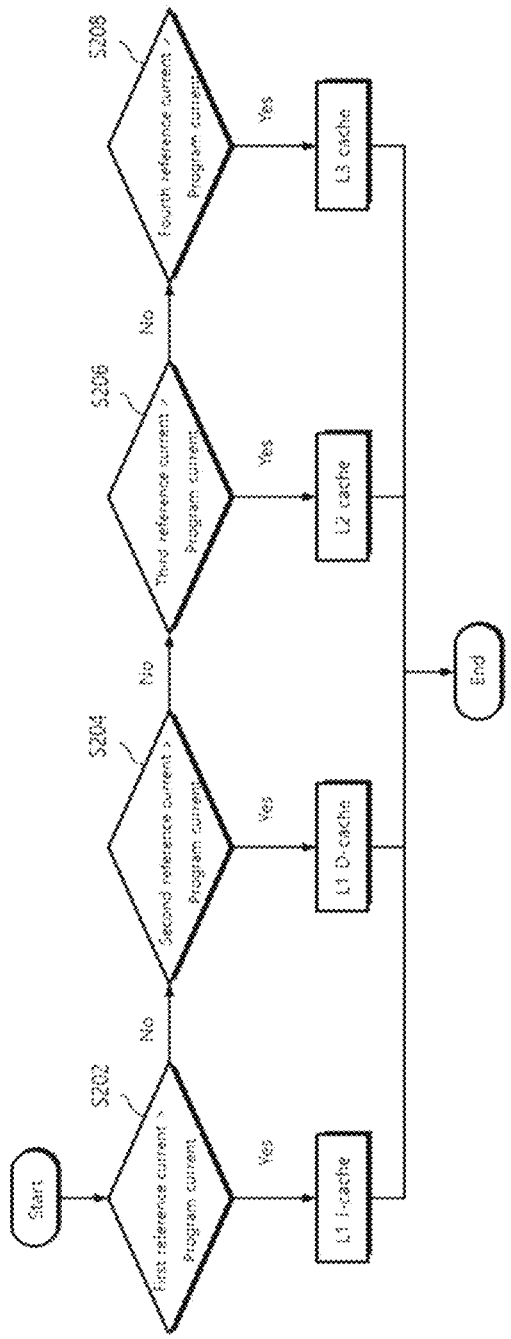

[FIG.5]
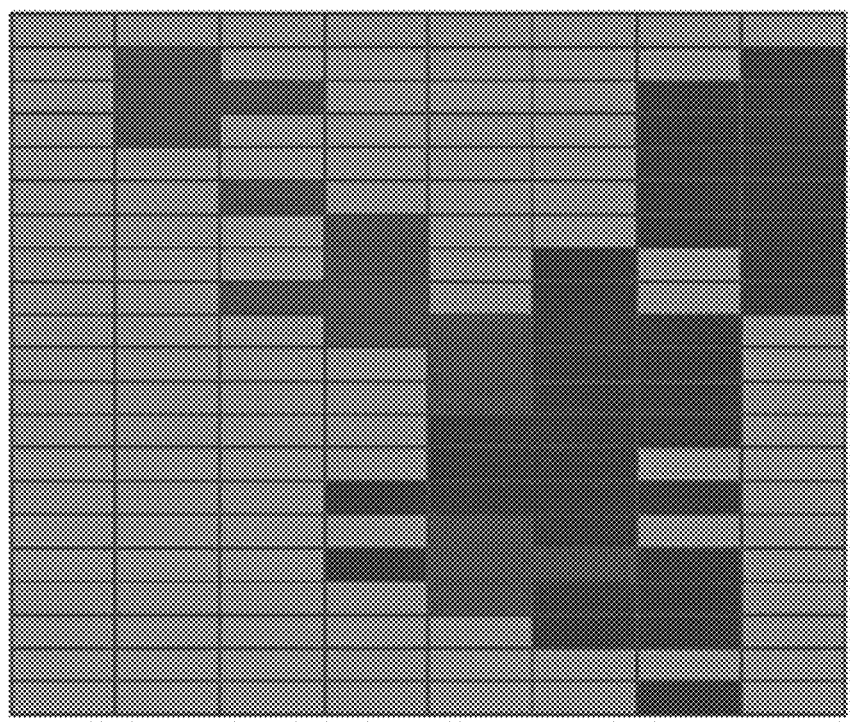

[FIG.6]
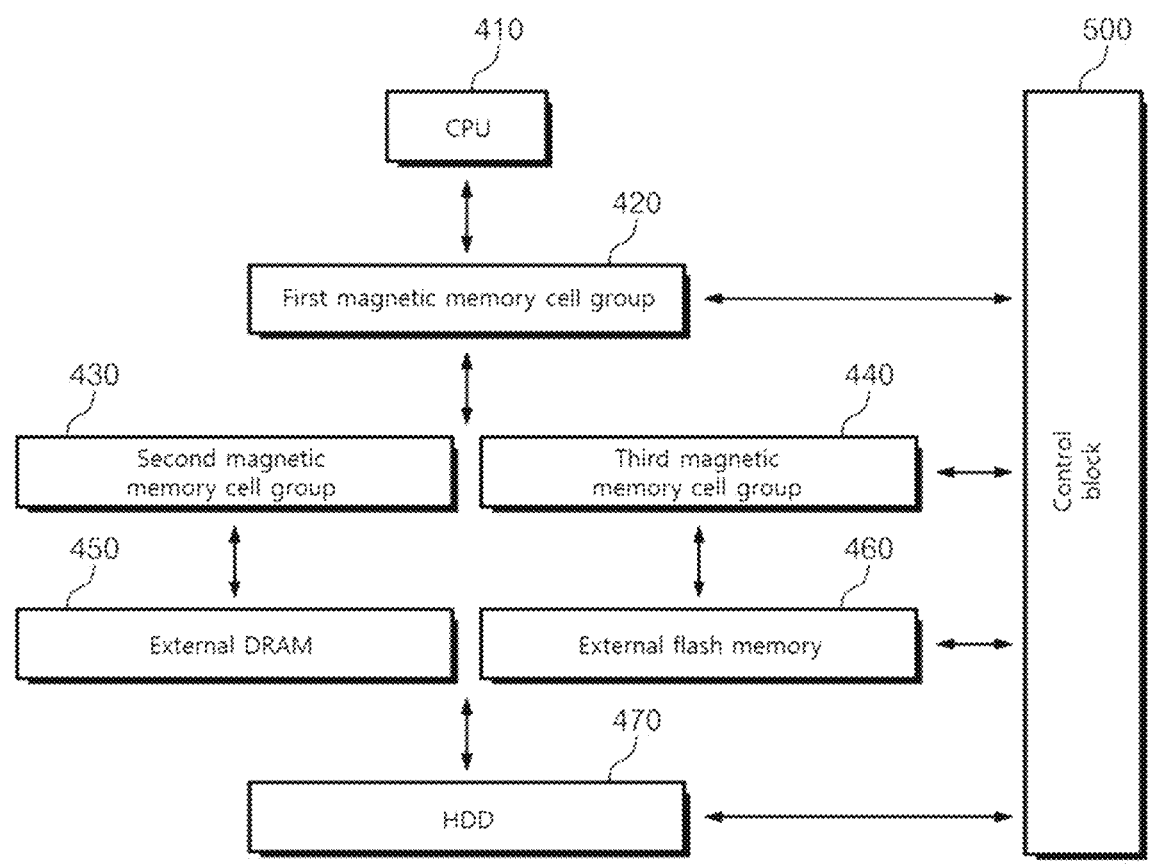

[FIG.7]
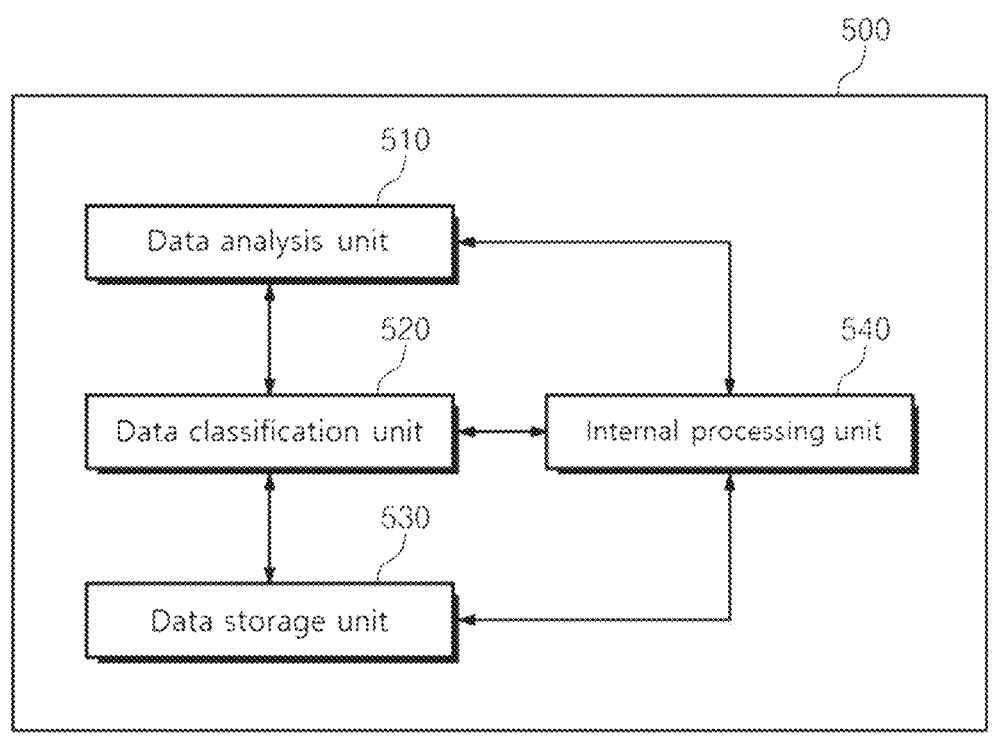

[FIG.8]
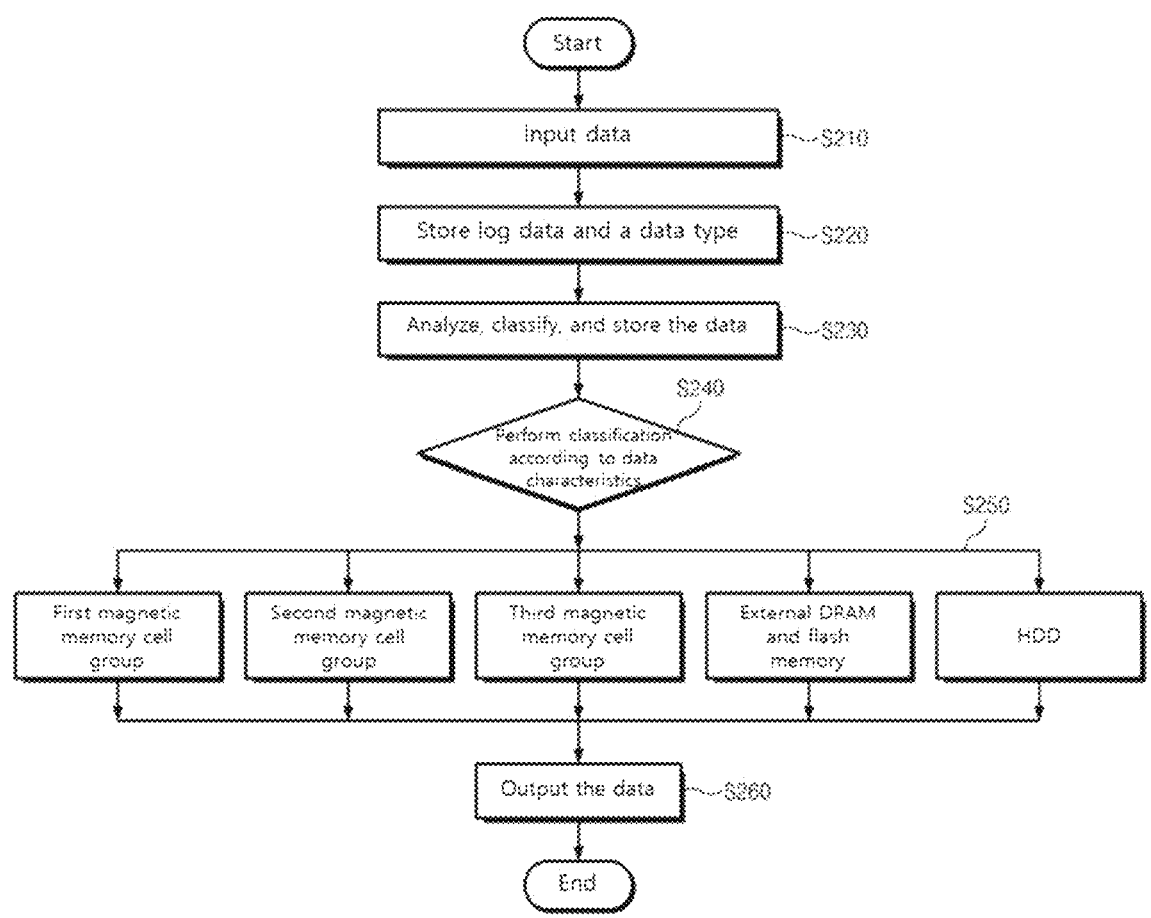

[FIG.9]
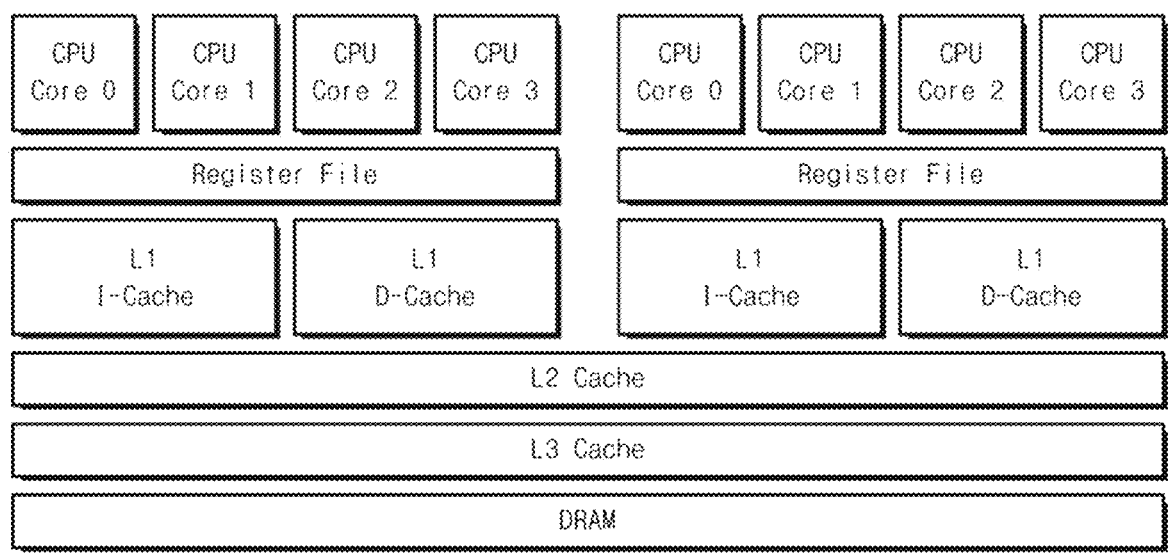

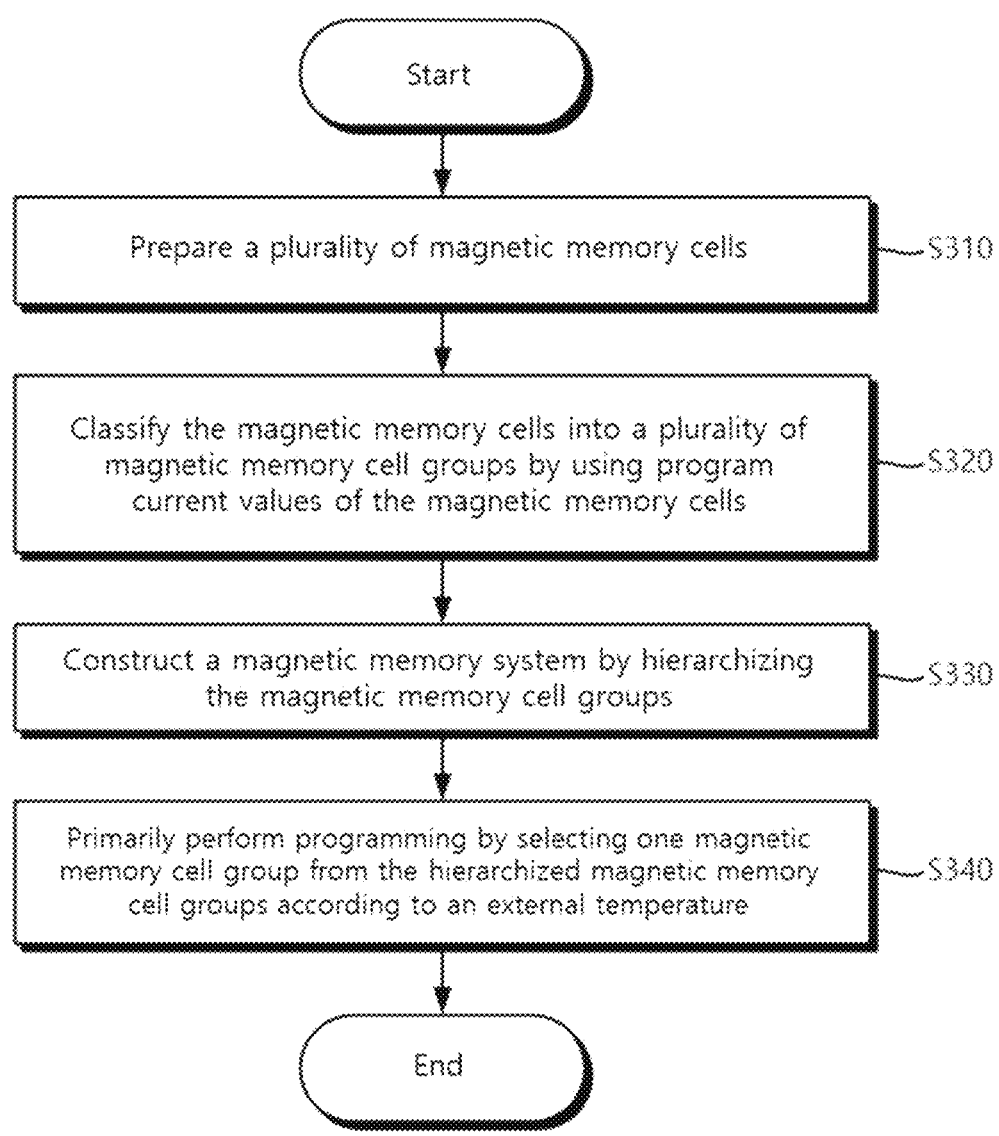
[FIG.10]

[FIG.11]
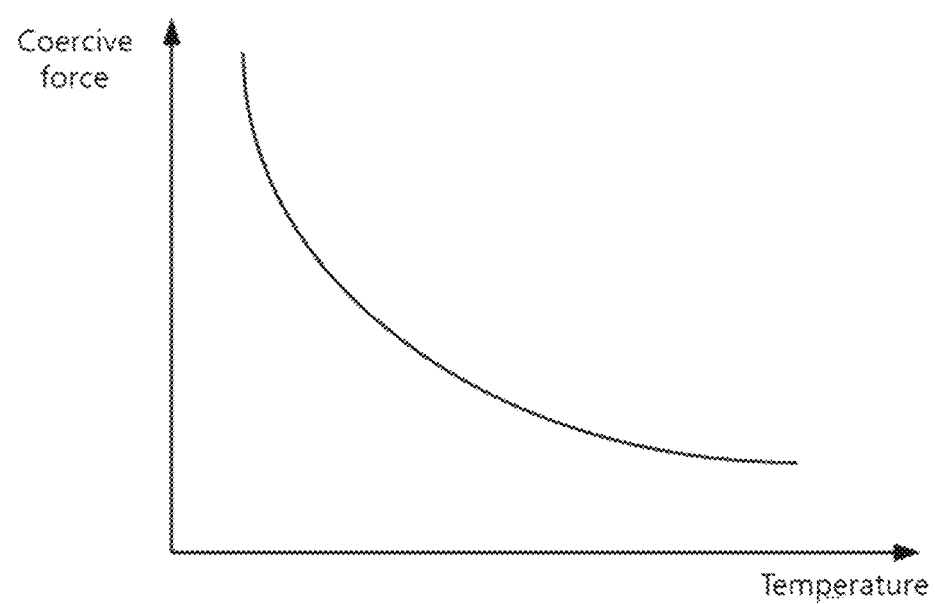

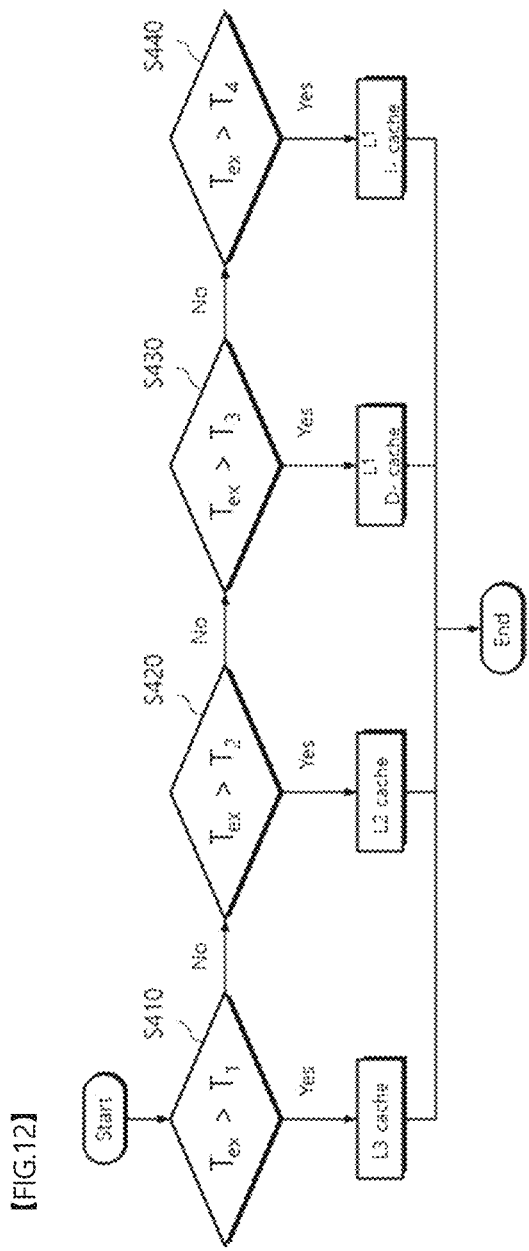

[FIG.13]
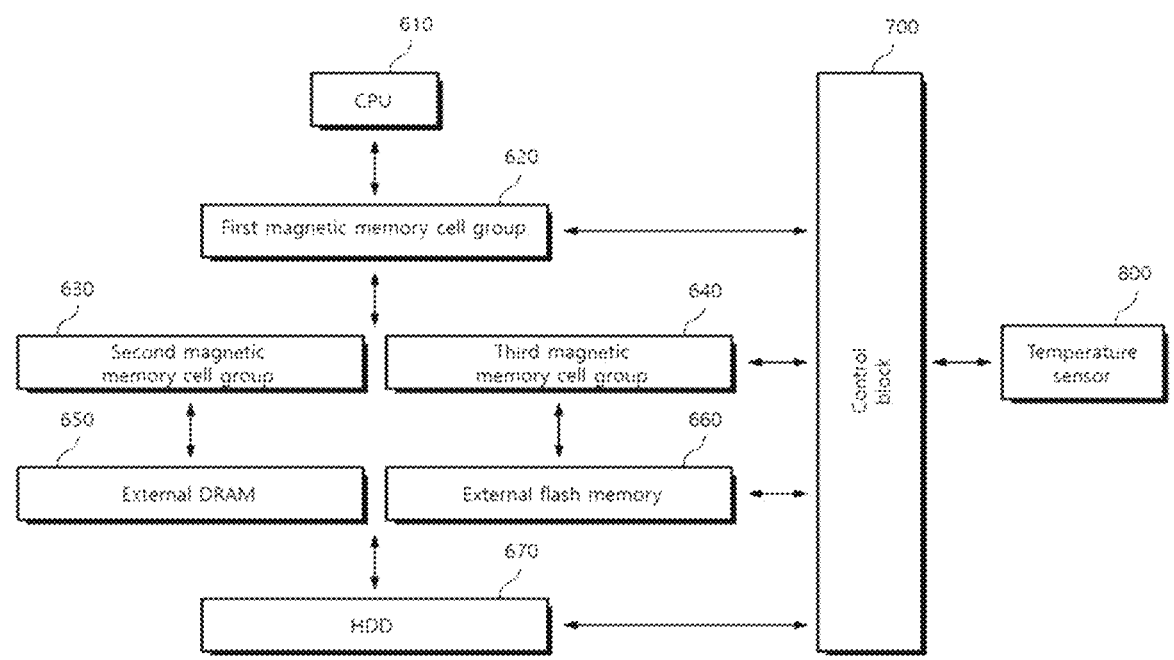

[FIG.14]
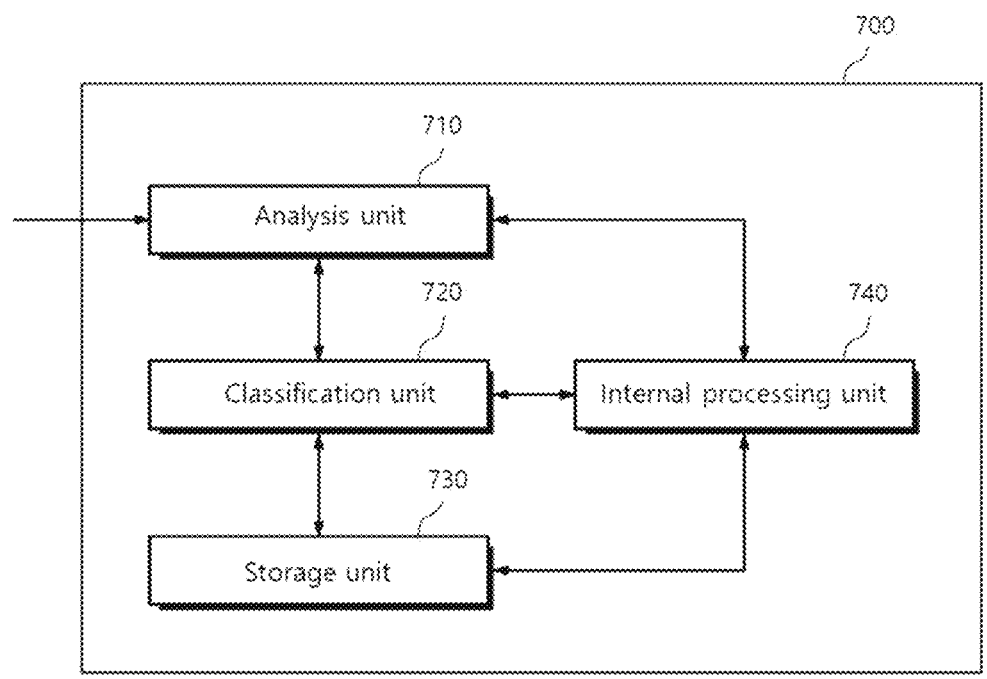

HIGH-RELIABILITY MAGNETIC MEMORY SYSTEM AND METHOD OF OPERATING THE SAME

BACKGROUND OF THE INVENTION

1. Field of the Invention

The present disclosure relates to a high-reliability magnetic memory system and a method of operating the same, and more particularly, to a high-reliability magnetic memory system including a plurality of magnetic memory cells, and a method of operating the high-reliability magnetic memory system.

2. Description of the Prior Art

As portable mobile devices such as smartphones and tablet PCs are rapidly popularized, and wearable devices such as smart watches and smart glasses are starting to be popularized, researches on memory systems that operate at a higher speed and have a lower operating voltage have been conducted.

Among the memory systems, a spin transfer torque-magnetic random access memory (STT-MRAM) refers to a memory configured to store information by changing magnetization directions of a free layer and a fixed layer. The STT-MRAM may be driven at a low power, and may operate at a high speed as compared with a conventional floating-type or trap-type memory, so that research and development on the STT-MRAM has been actively conducted.

In particular, since a cache memory applied to an application processor that may be currently considered as a core brain of smartphones, tablet PCs, and smart TVs has a bulky structure of 6T-SRAM, the cache memory may not match development of a scaling technology that is a microscale process, so that the cache memory has become a major factor of an increase in a size and a cost of a chip due to a large area and high power consumption, and a major factor of performance deterioration and an increased cost of a smart system due to the high power consumption.

For example, Korean Unexamined Patent Publication 10-2016-0134598 discloses a magnetic memory element including: tunnel junction unit cells in which a fixed magnetic layer, an insulating layer, and a free magnetic layer are sequentially stacked; a conductor configured to supply an in-plane current to the unit cells, and including an antiferromagnetic layer adjacent to the free magnetic layer and a ferromagnetic layer adjacent to the antiferromagnetic layer and having in-plane magnetic anisotropy; and a voltage application unit configured to independently apply a selection voltage to each of the tunnel junction unit cells, wherein a magnetization direction of each of the tunnel junction unit cells is selectively changed by the in-plane current and the selection voltage.

SUMMARY OF THE INVENTION

One technical object of the present disclosure is to provide a high-reliability magnetic memory system and a method of operating the same.

Another technical object of the present disclosure is to provide a magnetic memory system including a spin transfer torque-magnetic random access memory (STT-MRAM) with high reliability, and a method of constructing the magnetic memory system.

Still another technical object of the present disclosure is to provide a magnetic memory system including an STT-MRAM having an improved operating speed, and a method of constructing the magnetic memory system.

Yet another technical object of the present disclosure is to provide a magnetic memory system including a low-power STT-MRAM having a low driving voltage, and a method of constructing the magnetic memory system.

Still yet another technical object of the present disclosure is to provide a magnetic memory system including an STT-MRAM capable of facilitating a large-area manufacturing process, and a method of constructing the magnetic memory system.

Another technical object of the present disclosure is to provide a magnetic memory system capable of adaptively responding to an external temperature, and a method of operating the magnetic memory system.

Still another technical object of the present disclosure is to provide a magnetic memory system having an improved operating speed, and a method of operating the magnetic memory system.

Yet another technical object of the present disclosure is to provide a low-power magnetic memory system having a low driving voltage, and a method of operating the magnetic memory system.

Still yet another technical object of the present disclosure is to provide a magnetic memory system capable of facilitating a large-area manufacturing process, and a method of operating the magnetic memory system.

The technical objects of the present disclosure are not limited to the above-described objects.

In order to achieve the above technical objects, the present disclosure provides a method of constructing a magnetic memory system including an STT-MRAM.

In accordance with an embodiment, the method of constructing the magnetic memory system including the STT-MRAM includes: preparing a plurality of magnetic memory cells; classifying the magnetic memory cells into a plurality of magnetic memory cell groups by comparing a plurality of reference current values with program current values of the magnetic memory cells; and constructing a magnetic memory system by hierarchizing the magnetic memory cell groups.

According to an embodiment, the magnetic memory cells may be spin transfer torque-magnetic random access memories (STT-MRAMs).

According to an embodiment, the magnetic memory system may include a cache memory.

According to an embodiment, the classifying of the magnetic memory cells into the magnetic memory cell groups may include: classifying a magnetic memory cell, which has a program current value smaller than a first reference current value, as a first magnetic memory cell group by comparing the first reference current value with a program current value of the magnetic memory cell; classifying a magnetic memory cell, which has a program current value smaller than a second reference current value, as a second magnetic memory cell group by comparing the second reference current value, which is greater than the first reference current value, with the program current value of the magnetic memory cell; classifying a magnetic memory cell, which has a program current value smaller than a third reference current value, as a third magnetic memory cell group by comparing the third reference current value, which is greater than the second reference current value, with the program current value of the magnetic memory cell; and classifying a magnetic memory cell, which has a program current value smaller than a fourth reference current value, as a fourth magnetic memory cell group by comparing the fourth reference current value, which is greater than the third reference current value, with the program current value of the magnetic memory cell.

According to an embodiment, the constructing of the magnetic memory system by hierarchizing the magnetic memory cell groups may include: allocating the first magnetic memory cell group to an L1 I-cache; allocating the second magnetic memory cell group to an L1 D-cache; allocating the third magnetic memory cell group to an L2 cache; and allocating the fourth magnetic memory cell group to an L3 cache.

According to an embodiment, a program current value of the first magnetic memory cell group allocated to the L1 I-cache may be defined as the first reference current value, a program current value of the second magnetic memory cell group allocated to the L1 D-cache may be defined as the second reference current value, a program current value of the third magnetic memory cell group allocated to the L2 cache may be defined as the third reference current value, and a program current value of the fourth magnetic memory cell group allocated to the L3 cache may be defined as the fourth reference current value.

According to an embodiment, an average program current value of the magnetic memory cells classified as the first magnetic memory cell group allocated to the L1 I-cache may be smaller than an average program current value of the magnetic memory cells classified as the second magnetic memory cell group allocated to the L1 D-cache, the average program current value of the magnetic memory cells classified as the second magnetic memory cell group allocated to the L1 D-cache may be smaller than an average program current value of the magnetic memory cells classified as the third magnetic memory cell group allocated to the L2 cache, and the average program current value of the magnetic memory cells classified as the third magnetic memory cell group allocated to the L2 cache may be smaller than an average program current value of the magnetic memory cells classified as the fourth magnetic memory cell group allocated to the L3 cache.

According to an embodiment, the method of constructing the magnetic memory system including the STT-MRAM includes: preparing a plurality of magnetic memory cells; and allocating the magnetic memory cells to an L1 I-cache, an L1 D-cache, an L2 cache, and an L3 cache according to magnetization reversal states of the magnetic memory cells with respect to a plurality of reference current values.

In order to achieve the above technical objects, the present disclosure provides a magnetic memory system including an STT-MRAM.

In accordance with an embodiment, the magnetic memory system including the STT-MRAM includes: an L1 I-cache including a first magnetic memory cell group having a first program current value; an L1 D-cache including a second magnetic memory cell group having a second program current value that is higher than the first program current value; an L2 cache including a third magnetic memory cell group having a third program current value that is higher than the second program current value; and an L3 cache including a fourth magnetic memory cell group having a fourth program current value that is higher than the third program current value, wherein magnetic memory cells in the first to fourth magnetic memory cell groups are randomly distributed.

According to an embodiment, the magnetic memory cells having the first to fourth program current values may be spin transfer torque-magnetic random access memories (STT-MRAMs).

According to an embodiment, the magnetic memory system including the STT-MRAM may further include a control block configured to control the L1 I-cache, the L1 D-cache, the L2 cache, and the L3 cache, which are hierarchized.

In order to achieve the above technical objects, the present disclosure provides a method of operating a magnetic memory system.

In accordance with an embodiment, the method of operating the magnetic memory system includes: preparing a plurality of magnetic memory cells; classifying the magnetic memory cells into a plurality of magnetic memory cell groups by using program current values of the magnetic memory cells; constructing a magnetic memory system by hierarchizing the magnetic memory cell groups; and primarily performing programming by selecting one magnetic memory cell group from the hierarchized magnetic memory cell groups according to an external temperature.

According to an embodiment, the magnetic memory cell groups may include: a first magnetic memory cell group having a relatively low program current value; and a second magnetic memory cell group having a relatively high program current value.

According to an embodiment, the performing of the programming may include: primarily performing the programming on the second magnetic memory cell group when the external temperature is higher than a reference temperature; and primarily performing the programming on the first magnetic memory cell group when the external temperature is lower than the reference temperature.

According to an embodiment, the magnetic memory cells may be spin transfer torque-magnetic random access memories (STT-MRAMs).

According to an embodiment, the classifying of the magnetic memory cells into the magnetic memory cell groups may include: classifying a magnetic memory cell, which has a program current value smaller than a first reference current value, as a first magnetic memory cell group by comparing the first reference current value with a program current value of the magnetic memory cell; classifying a magnetic memory cell, which has a program current value smaller than a second reference current value, as a second magnetic memory cell group by comparing the second reference current value, which is greater than the first reference current value, with the program current value of the magnetic memory cell; classifying a magnetic memory cell, which has a program current value smaller than a third reference current value, as a third magnetic memory cell group by comparing the third reference current value, which is greater than the second reference current value, with the program current value of the magnetic memory cell; and classifying a magnetic memory cell, which has a program current value smaller than a fourth reference current value, as a fourth magnetic memory cell group by comparing the fourth reference current value, which is greater than the third reference current value, with the program current value of the magnetic memory cell.

According to an embodiment, the constructing of the magnetic memory system by hierarchizing the magnetic memory cell groups may include: allocating the first magnetic memory cell group to an L1 I-cache; allocating the second magnetic memory cell group to an L1 D-cache;

allocating the third magnetic memory cell group to an L2 cache; and allocating the fourth magnetic memory cell group to an L3 cache.

According to an embodiment, the primarily performing of the programming by selecting the one magnetic memory cell group according to the external temperature may include: comparing a first reference temperature with the external temperature to primarily perform the programming by selecting the L3 cache when the external temperature is higher than the first reference temperature; comparing a second reference temperature, which is lower than the first reference temperature, with the external temperature to primarily perform the programming by selecting the L2 cache when the external temperature is higher than the second reference temperature; comparing a third reference temperature, which is lower than the second reference temperature, with the external temperature to primarily perform the programming by selecting the L1 D-cache when the external temperature is higher than the third reference temperature; and comparing a fourth reference temperature, which is lower than the third reference temperature, with the external temperature to primarily perform the programming by selecting the L1 I-cache when the external temperature is higher than the fourth reference temperature.

In order to achieve the above technical objects, the present disclosure provides a magnetic memory system.

In accordance with an embodiment, the magnetic memory system includes: a temperature sensor configured to measure an external temperature; a first magnetic memory cell group having a first program current value; a second magnetic memory cell group having a second program current value that is higher than the first program current value; and a control unit configured to primarily perform programming by selecting one of the first magnetic memory cell group or the second magnetic memory cell group according to the external temperature measured by the temperature sensor.

According to an embodiment, the control unit may be configured to: primarily perform the programming on the second magnetic memory cell group when the external temperature is higher than a reference temperature; and primarily perform the programming on the first magnetic memory cell group when the external temperature is lower than the reference temperature.

According to an embodiment, the first magnetic memory cell group and the second magnetic memory cell group may constitute a cache memory.

According to an embodiment, in the cache memory, the first magnetic memory cell group may belong to a higher hierarchy as compared with the second magnetic memory cell group.

According to an embodiment, an average program current value of the magnetic memory cells included in the first magnetic memory cell group may be smaller than an average program current value of the magnetic memory cells included in the second magnetic memory cell group.

In accordance with an embodiment of the present disclosure, a method of constructing a magnetic memory system including an STT-MRAM includes: preparing a plurality of magnetic memory cells; classifying the magnetic memory cells into a plurality of magnetic memory cell groups by comparing a plurality of reference current values with program current values of the magnetic memory cells; and constructing a magnetic memory system by hierarchizing the magnetic memory cell groups.

The magnetic memory system can be configured such that the magnetic memory cells are classified into the magnetic memory cell groups by comparing the program current values of the magnetic memory cells, which have mutually different program current values, with the reference current values, and the magnetic memory cell groups are hierarchized. Accordingly, a magnetic memory system with high efficiency and high reliability can be provided. In addition, the magnetic memory system can be easily constructed by using a plurality of magnetic memory cells, which are manufactured on a large-area wafer to have a difference in program current values.

In addition, in accordance with an embodiment of the present disclosure, a hierarchized magnetic memory system can be constructed by classifying a plurality of magnetic memory cells into a plurality of magnetic memory cell groups by using program current values of the magnetic memory cells, and programming can be primarily performed by selecting one magnetic memory cell group from the magnetic memory cell groups, which are hierarchized, according to an external temperature.

Accordingly, in a low-temperature environment, power consumption can be prevented from being increased by an increase in a program current caused by an increase in a coercive force during a program operation, and in a high-temperature environment, a loss of data stored in the magnetic memory cell can be minimized, so that a rate of performing a data recovery algorithm can be prevented from being increased. Therefore, a magnetic memory system that is stably driven in various external environments and a method of operating the magnetic memory system can be provided.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1 is a view for describing a structure of an STT-MRAM, which is included in a magnetic memory system including an STT-MRAM according to a first embodiment of the present disclosure.

FIG. 2 is a view for describing information storage characteristics according to a magnetization direction of the STT-MRAM included in the magnetic memory system including the STT-MRAM according to the first embodiment of the present disclosure.

FIG. 3 is a flowchart for describing a method of constructing the magnetic memory system including the STT-MRAM according to the first embodiment of the present disclosure.

FIG. 4 is a view showing an algorithm for classifying and hierarchizing a plurality of magnetic memory cell groups according to the first embodiment of the present disclosure.

FIG. 5 is a view showing a simulation result of the magnetic memory system including the STT-MRAM according to the first embodiment of the present disclosure.

FIG. 6 is a block diagram for describing an electronic element including the magnetic memory system according to the first embodiment of the present disclosure.

FIG. 7 is a block diagram for describing a control block included in the electronic element including the magnetic memory system according to the first embodiment of the present disclosure.

FIG. 8 is a flowchart for describing an operation of the electronic element including the magnetic memory system according to the first embodiment of the present disclosure.

FIG. 9 is a block diagram for describing another embodiment of an electronic element, which includes the magnetic memory system according to the first embodiment of the present disclosure.

FIG. 10 is a flowchart for describing a method of operating a magnetic memory system according to a second embodiment of the present disclosure.

FIG. 11 is a graph for describing a variation in a coercive force according to a temperature of a magnetic memory cell included in the magnetic memory system according to the second embodiment of the present disclosure.

FIG. 12 is a flowchart for describing a programming process according to an external temperature in the method of operating the magnetic memory system according to the second embodiment of the present disclosure.

FIG. 13 is a block diagram for describing an electronic element including the magnetic memory system according to the second embodiment of the present disclosure.

FIG. 14 is a block diagram for describing a control unit included in the magnetic memory system according to the second embodiment of the present disclosure.

DETAILED DESCRIPTION OF THE EXEMPLARY EMBODIMENTS

Hereinafter, exemplary embodiments of the present disclosure will be described in detail with reference to the accompanying drawings. However, the technical idea of the present disclosure is not limited to the embodiments, but may be realized in different forms. The embodiments introduced herein are provided to sufficiently deliver the idea of the present disclosure to those skilled in the art so that the disclosed contents may become thorough and complete.

When it is mentioned in the present disclosure that one element is on another element, it means that a first element may be directly formed on a second element, or a third element may be interposed between the first element and the second element. Further, in the drawings, thicknesses of membranes and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the terms such as "including" and "having" are used to designate the presence of features, numbers, steps, elements, or combinations thereof described in the present disclosure, and shall not be construed to preclude any possibility of presence or addition of one or more other features, numbers, steps, elements, or combinations thereof. In addition, the term "connection" used herein is used to include both indirectly and directly connecting a plurality of elements.

Further, in the following description of the present disclosure, detailed descriptions of known functions and configurations incorporated herein will be omitted when they may make the subject matter of the present disclosure unnecessarily unclear.

A magnetic memory system and a method of constructing the same according to a first embodiment of the present disclosure will be described with reference to FIGS. 1 to 9.

FIG. 1 is a view for describing a structure of an STT-MRAM, which is included in a magnetic memory system including an STT-MRAM according to a first embodiment of the present disclosure, and FIG. 2 is a view for describing information storage characteristics according to a magnetization direction of the STT-MRAM included in the magnetic memory system including the STT-MRAM according to the first embodiment of the present disclosure.

Referring to FIGS. 1 and 2, a spin transfer torque-magnetic random access memory (STT-MRAM) 100 according to one embodiment of the present disclosure may include an upper electrode 120, a lower electrode 140, a first magnetization reversal element 200, and a second magnetization reversal element 300.

The first magnetization reversal element 200 may include a first variable magnetization layer 210, a first tunneling barrier layer 220, and a first fixed magnetization layer 230. The second magnetization reversal element 300 may include a second variable magnetization layer 310, a second tunneling barrier layer 320, and a second fixed magnetization layer 330. The first magnetization reversal element 200 and the second magnetization reversal element 300 may be connected in series, and may have mutually different program current densities Jn.

In other words, a value of a first program current density J1 required to reverse a magnetization direction of the first variable magnetization layer 210 in the first magnetization reversal element 200 may be different from a value of a second program current density J2 required to reverse a magnetization direction of the second variable magnetization layer 310 in the second magnetization reversal element 300. For example, the value of the second program current density J2 of the second magnetization reversal element 300 may be greater than the value of the first program current density J1 of the first magnetization reversal element 200.

In addition, an STT-MRAM according to another embodiment of the present disclosure may include a conductive layer (not shown) provided between the first magnetization reversal element 200 and the second magnetization reversal element 300.

A high-resistance state of each of the first magnetization reversal element 200 and the second magnetization reversal element 300 may be defined as "1", and a low-resistance state of each of the first magnetization reversal element 200 and the second magnetization reversal element 300 may be defined as "0".

According to one embodiment, when the magnetization direction of the first variable magnetization layer 210 is antiparallel to a magnetization direction of the first fixed magnetization layer 230 in the first magnetization reversal element 200, and when the magnetization direction of the second variable magnetization layer 310 is antiparallel to a magnetization direction of the second fixed magnetization layer 330 in the second magnetization reversal element 300, the first magnetization reversal element 200 and the second magnetization reversal element 300 may be defined to be in the high-resistance states, respectively.

According to one embodiment, when the magnetization direction of the first variable magnetization layer 210 is parallel to the magnetization direction of the first fixed magnetization layer 230 in the first magnetization reversal element 200, and when the magnetization direction of the second variable magnetization layer 310 is parallel to the magnetization direction of the second fixed magnetization layer 330 in the second magnetization reversal element 300, the first magnetization reversal element 200 and the second magnetization reversal element 300 may be defined to be in the low-resistance states, respectively.

The STT-MRAM 100 may have a structure in which the first magnetization reversal element 200 and the second magnetization reversal element 300 are stacked. Accordingly, the STT MRAM 100 may be expressed in four resistance states of "11", "01", "10", and "00". In other words, when both the first magnetization reversal element 200 and the second magnetization reversal element 300 are in the high-resistance state (the first variable magnetization layer 210 and the first fixed magnetization layer 230 are antiparallel to each other, and the second variable magnetization layer 310 and the second fixed magnetization layer 330 are antiparallel to each other), the STT-MRAM 100 may be defined to be in a "11" resistance state. In addition, when the first magnetization reversal element 200 is in the low-resistance state (the first variable magnetization layer 210 and the first fixed magnetization layer 230 are parallel to each other), and the second magnetization reversal element 300 is in the high-resistance state (the second variable magnetization layer 310 and the second fixed magnetization layer 330 are antiparallel to each other), the STT-MRAM 100 may be defined to be in a "10" resistance state. Further, when the first magnetization reversal element 200 is in the high-resistance state (the first variable magnetization layer 210 and the first fixed magnetization layer 230 are antiparallel to each other), and the second magnetization reversal element 300 is in the low-resistance state (the second variable magnetization layer 310 and the second fixed magnetization layer 330 are parallel to each other), the STT-MRAM 100 may be defined to be in a "01" resistance state. In addition, when both the first magnetization reversal element 200 and the second magnetization reversal element 300 are in the low-resistance state (the first variable magnetization layer 210 and the first fixed magnetization layer 230 are parallel to each other, and the second variable magnetization layer 310 and the second fixed magnetization layer 330 are parallel to each other), the STT-MRAM 100 may be defined to be in a "00" resistance state.

The "11" resistance state may be implemented by applying, in the "00" resistance state, a program current having a size that is greater than the second program current density J2 (the program current density of the second magnetization reversal element 300) in a direction from the upper electrode 120 to the lower electrode 140. The "01" resistance state may be implemented by applying, in the "00" resistance state, a program current having a size that is greater than the first program current density J1 and smaller than the second program current density J2 in the direction from the upper electrode 120 to the lower electrode 140. The "10" resistance state may be implemented by applying, in the "11" resistance state, a program current that is smaller than the second program current density J2 and greater than the first program current density J1 in a direction from the lower electrode 140 to the upper electrode 120.

FIG. 3 is a flowchart for describing a method of constructing the magnetic memory system including the STT-MRAM according to the first embodiment of the present disclosure, FIG. 4 is a view showing an algorithm for classifying and hierarchizing a plurality of magnetic memory cell groups according to the first embodiment of the present disclosure, and FIG. 5 is a view showing a simulation result of the magnetic memory system including the STT-MRAM according to the first embodiment of the present disclosure.

Referring to FIGS. 3 and 4, a plurality of magnetic memory cells may be prepared (S110). According to one embodiment, the magnetic memory cells may include a spin transfer torque-magnetic random access memory (STT-MRAM). For example, the magnetic memory cells may have the same structure as the structure described with reference to FIG. 1. In addition, for example, the magnetic memory cells may operate as described with reference to FIG. 2.

Even when the magnetic memory cells are formed of the same material by the same process, program current values of the magnetic memory cells may be different from each other due to a process variation, which is a minute difference in a thickness of a film constituting the magnetic memory cell. For example, even when the magnetic memory cells are formed on the same wafer, a program current value of a magnetic memory cell formed on an edge of the wafer and a magnetic memory cell formed on a central portion of the wafer may be different from each other. In particular, when the magnetic memory cells include the first magnetization reversal element 200 and the second magnetization reversal element 300, which are stacked, as shown in FIG. 1, it may not be easy to manufacture the magnetic memory cells such that the magnetic memory cells have the same program current value.

The magnetic memory cells may be classified into a plurality of magnetic memory cell groups by comparing a plurality of reference current values with program current values of the magnetic memory cells (S120).

The classifying of the magnetic memory cells into the magnetic memory cell groups may include: classifying a magnetic memory cell, which has a program current value smaller than a first reference current value, as a first magnetic memory cell group by comparing the first reference current value with a program current value of the magnetic memory cell (S202); classifying a magnetic memory cell, which has a program current value smaller than a second reference current value, as a second magnetic memory cell group by comparing the second reference current value with the program current value of the magnetic memory cell (S204); classifying a magnetic memory cell, which has a program current value smaller than a third reference current value, as a third magnetic memory cell group by comparing the third reference current value with the program current value of the magnetic memory cell (S206); and classifying a magnetic memory cell, which has a program current value smaller than a fourth reference current value, as a fourth magnetic memory cell group by comparing the fourth reference current value with the program current value of the magnetic memory cell (S208).

The first reference current value may be smaller than the second reference current value, the second reference current value may be smaller than the third reference current value, and the third reference current value may be smaller than the fourth reference current value. Accordingly, the program current value of the magnetic memory cell classified as the first magnetic memory cell group may be smaller than the program current value of the magnetic memory cell classified as the second magnetic memory cell group, the program current value of the magnetic memory cell classified as the second magnetic memory cell group may be smaller than the program current value of the magnetic memory cell classified as the third magnetic memory cell group, and the program current value of the magnetic memory cell classified as the third magnetic memory cell group may be smaller than the program current value of the magnetic memory cell classified as the fourth magnetic memory cell group.

According to one embodiment, a magnetic memory cell array in which magnetic memory cells are two-dimensionally arranged may be prepared. The magnetic memory cell array may be divided into arbitrary shapes and arbitrary regions. Thereafter, in the magnetic memory cell array, sampling may be performed in the divided arbitrary regions, and a sampled magnetic memory cell may be classified into the magnetic memory cell groups based on a program current value of the sampled magnetic memory cell by the method described with reference to FIGS. 3 and 4. All of the remaining magnetic memory cells within the arbitrary region, which is subject to the sampling, may be defined as the same magnetic memory cell group as the magnetic memory cell group to which the sampled magnetic memory cell belongs. For example, when the sampled magnetic memory cell is classified as the first magnetic memory cell group, the remaining magnetic memory cells around the sampled magnetic memory cell within the arbitrary region may also be classified as the first magnetic memory cell group.

The magnetic memory cell groups may be hierarchized (S130). The magnetic memory system may include a cache memory.

The hierarchizing of the magnetic memory cell groups may include: allocating the first magnetic memory cell group to an L1 I-cache; allocating the second magnetic memory cell group to an L1 D-cache; allocating the third magnetic memory cell group to an L2 cache; and allocating the fourth magnetic memory cell group to an L3 cache. In this case, according to one embodiment, a program current value of the first magnetic memory cell group allocated to the L1 I-cache may be defined as the first reference current value, a program current value of the second magnetic memory cell group allocated to the L1 D-cache may be defined as the second reference current value, a program current value of the third magnetic memory cell group allocated to the L2 cache may be defined as the third reference current value, and a program current value of the fourth magnetic memory cell group allocated to the L3 cache may be defined as the fourth reference current value.

An average program current value of the magnetic memory cells classified as the first magnetic memory cell group allocated to the L1 I-cache may be smaller than an average program current value of the magnetic memory cells classified as the second magnetic memory cell group allocated to the L1 D-cache, the average program current value of the magnetic memory cells classified as the second magnetic memory cell group allocated to the L1 D-cache may be smaller than an average program current value of the magnetic memory cells classified as the third magnetic memory cell group allocated to the L2 cache, and the average program current value of the magnetic memory cells classified as the third magnetic memory cell group allocated to the L2 cache may be smaller than an average program current value of the magnetic memory cells classified as the fourth magnetic memory cell group allocated to the L3 cache.

In addition, the method of constructing the magnetic memory system may include allocating the magnetic memory cells to an L1 I-cache, an L1 D-cache, an L2 cache, and an L3 cache according to magnetization reversal states of the magnetic memory cells with respect to the reference current values. In other words, a magnetic memory cell that is subject to magnetization reversal by the first reference current value may be classified as the first magnetic memory cell group so as to be allocated to the L1 I-cache. In addition, a magnetic memory cell that is subject to the magnetization reversal by the second reference current value without being subject to the magnetization reversal by the first reference current value may be classified as the second magnetic memory cell group so as to be allocated to the L1 D-cache. Further, a magnetic memory cell that is subject to the magnetization reversal by the third reference current value without being subject to the magnetization reversal by the second reference current value may be classified as the third memory cell group so as to be allocated to the L2 cache. In addition, a magnetic memory cells that is subject to the magnetization reversal by the fourth reference current value without being subject to the magnetization reversal by the third reference current value may be classified as the fourth memory cell group so as to be allocated to the L3 cache.

According to the method of constructing the magnetic memory system in accordance with the embodiment of the present disclosure, the magnetic memory cells may be classified into the magnetic memory cell groups by comparing the program current values of the magnetic memory cells, which have mutually different program current values, with the reference current values, and the magnetic memory cell groups may be hierarchized.

Unlike the above-described embodiment of the present disclosure, when a plurality of magnetic memory cells are not classified and hierarchized by using a difference in program current values, it may not be easy to construct a memory system by using the magnetic memory cells due to mutually different program current values of the magnetic memory cells. In addition, when the magnetic memory cells are manufactured on a large-area wafer, it may not be easy to manufacture the magnetic memory cells such that the magnetic memory cells have substantially the same program current value. Accordingly, it may be more difficult to construct a magnetic memory system by using the magnetic memory cells manufactured on the large-area wafer.

However, in accordance with the embodiment of the present disclosure, the magnetic memory cells may be hierarchized by using a difference in the program current values of the magnetic memory cells. Accordingly, a magnetic memory system with high efficiency and high reliability may be provided. In addition, the magnetic memory system may be easily constructed by using a plurality of magnetic memory cells, which are manufactured on a large-area wafer to have a difference in program current values.

Referring to FIG. 5, a plurality of magnetic memory cells were prepared, the magnetic memory cells were classified according to the method of constructing the magnetic memory system described with reference to FIGS. 3 and 4, and a simulation result was shown in FIG. 5. As shown in FIG. 5, a magnetic memory system including a first magnetic memory cell group having a first program current value, a second magnetic memory cell group having a second program current value that is higher than the first program current value, a third magnetic memory cell group having a third program current value that is higher than the second program current value, and a fourth magnetic memory cell group having a fourth program current value that is higher than the third program current value was constructed. It may be found that the magnetic memory cells in the first to fourth magnetic memory cell groups are randomly distributed.

FIG. 6 is a block diagram for describing an electronic element including the magnetic memory system according to the first embodiment of the present disclosure, and FIG. 7 is a block diagram for describing a control block included in the electronic element including the magnetic memory system according to the first embodiment of the present disclosure.

Referring to FIGS. 6 and 7, an electronic element including a CPU 410, a first magnetic memory cell group 420, a second magnetic memory cell group 430, a third magnetic memory cell group 440, an external DRAM 450, an external flash memory 460, an HDD 470, and a control block 500 may be prepared. The first to third magnetic memory cell groups 420 to 440 may be magnetic memory cell groups to which a plurality of magnetic memory cells are classified and allocated by the method described with reference to FIGS. 3 and 4. A program current value of a magnetic memory cell classified as the first magnetic memory cell group 420 may be smaller than a program current value of a magnetic memory cell classified as the second magnetic memory cell group 430, and the program current value of the magnetic memory cell classified as the second magnetic memory cell group 430 may be smaller than a program current value of a magnetic memory cell classified as the third magnetic memory cell group 440.

The control block 500 may classify data of a user, and may determine a storage location of the data according to characteristics of the classified data. In detail, the control block 500 may include a data analysis unit 510, a data classification unit 520, a data storage unit 530, and an internal processing unit 540.

The data analysis unit 510 may analyze usage data of the user. The data classification unit 520 may classify the usage data of the user based on scenario data of the user. The data storage unit 530 may store the classified data for each data class. The internal processing unit 540 may include an internal memory for classifying and storing the data, and may control the data analysis unit 510, the data classification unit 520, and the data storage unit 530.

According to the embodiment of the present disclosure, the electronic element manufactured to include the first to third magnetic memory cell groups 420 to 440 may have an advantage that respective steps may be organically combined to implement an ultra-low power and a high degree of integration.

FIG. 8 is a flowchart for describing an operation of the electronic element including the magnetic memory system according to the first embodiment of the present disclosure.

Referring to FIG. 8, the electronic element manufactured by the method described with reference to FIGS. 6 and 7 may be prepared. The user data may be input to the electronic element (S210). Log data and a data type of the input user data may be stored (S220). According to one embodiment, the log data may include start and end times, and the data type may include a text, a video, a system-related item, and the like. The stored data may be analyzed, classified, and stored in a control block (S230). The analyzed, classified, and stored data may be classified again in the method described with reference to FIGS. 3 and 4 according to data characteristics (S240). According to one embodiment, the data characteristics may include a read speed, a write speed, a usage frequency, and the like. The data classified according to the data characteristics may be stored in the first magnetic memory cell group 420, the second magnetic memory cell group 430, the third magnetic memory cell group 440, the external DRAM 450, the external flash memory 460, or the HDD 470 described with reference to FIG. 6 according to the characteristics (S250).

The data stored in the first magnetic memory cell group 420, the second magnetic memory cell group 430, the third magnetic memory cell group 440, the external DRAM 450, the external flash memory 460, or the HDD 470 may be output according to a request of the user (S260).

FIG. 9 is a block diagram for describing another embodiment of an electronic element, which includes the magnetic memory system according to the first embodiment of the present disclosure.

Referring to FIG. 9, an electronic element including an L1 I-cache, an L1 D-cache, an L2 cache, an L3 cache, first to eighth CPUs, a first register, a second register, and a DRAM may be prepared. The L1 I-cache, the L1 D-cache, the L2 cache, and the L3 cache may be caches to which a plurality of magnetic memory cells are classified and allocated by the method described with reference to FIGS. 3 and 4.

An average program current value of the magnetic memory cells classified as the first magnetic memory cell group allocated to the L1 I-cache may be smaller than an average program current value of the magnetic memory cells classified as the second magnetic memory cell group allocated to the L1 D-cache, the average program current value of the magnetic memory cells classified as the second magnetic memory cell group allocated to the L1 D-cache may be smaller than an average program current value of the magnetic memory cells classified as the third magnetic memory cell group allocated to the L2 cache, and the average program current value of the magnetic memory cells classified as the third magnetic memory cell group allocated to the L2 cache may be smaller than an average program current value of the magnetic memory cells classified as the fourth magnetic memory cell group allocated to the L3 cache.

In addition, as will be described below with reference to FIGS. 11 and 12, programming may be primarily performed by selecting one of the L1 I-cache, the L1 D-cache, the L2 cache, and the L3 cache according to an external temperature.

Accordingly, a magnetic memory system that is stably driven even in a low-temperature environment and a high-temperature environment and capable of minimizing an increase in power consumption may be provided.

Hereinafter, a magnetic memory system and a method of operating the same according to a second embodiment of the present disclosure will be described with reference to FIGS. 10 to 14.

FIG. 10 is a flowchart for describing a method of operating a magnetic memory system according to a second embodiment of the present disclosure, FIG. 11 is a graph for describing a variation in a coercive force according to a temperature of a magnetic memory cell included in the magnetic memory system according to the second embodiment of the present disclosure, and FIG. 12 is a flowchart for describing a programming process according to an external temperature in the method of operating the magnetic memory system according to the second embodiment of the present disclosure.

Referring to FIG. 10, a plurality of magnetic memory cells may be prepared (S310).

According to one embodiment, the magnetic memory cells may include a spin transfer torque-magnetic random access memory (STT-MRAM). For example, the magnetic memory cells may have the same structure as the structure described with reference to FIG. 1. In addition, for example, the magnetic memory cells may operate as described with reference to FIG. 2.

Even when the magnetic memory cells are formed of the same material by the same process, program current values of the magnetic memory cells may be different from each other due to a process variation, which is a minute difference in a thickness of a film constituting the magnetic memory cell. For example, even when the magnetic memory cells are formed on the same wafer, a program current value of a magnetic memory cell formed on an edge of the wafer and a magnetic memory cell formed on a central portion of the wafer may be different from each other. In particular, when the magnetic memory cells include the first magnetization reversal element 200 and the second magnetization reversal element 300, which are stacked, as shown in FIG. 1, it may not be easy to manufacture the magnetic memory cells such that the magnetic memory cells have the same program current value.

Referring to FIG. 10, the magnetic memory cells may be classified into a plurality of magnetic memory cell groups by comparing a plurality of reference current values with program current values of the magnetic memory cells (S320).

As described with reference to FIG. 4, the classifying of the magnetic memory cells into the magnetic memory cell groups may include: classifying a magnetic memory cell, which has a program current value smaller than a first reference current value, as a first magnetic memory cell group by comparing the first reference current value with a program current value of the magnetic memory cell (S202); classifying a magnetic memory cell, which has a program current value smaller than a second reference current value, as a second magnetic memory cell group by comparing the second reference current value with the program current value of the magnetic memory cell (S204); classifying a magnetic memory cell, which has a program current value smaller than a third reference current value, as a third magnetic memory cell group by comparing the third reference current value with the program current value of the magnetic memory cell (S206); and classifying a magnetic memory cell, which has a program current value smaller than a fourth reference current value, as a fourth magnetic memory cell group by comparing the fourth reference current value with the program current value of the magnetic memory cell (S208).

The first reference current value may be smaller than the second reference current value, the second reference current value may be smaller than the third reference current value, and the third reference current value may be smaller than the fourth reference current value. Accordingly, the program current value of the magnetic memory cell classified as the first magnetic memory cell group may be smaller than the program current value of the magnetic memory cell classified as the second magnetic memory cell group, the program current value of the magnetic memory cell classified as the second magnetic memory cell group may be smaller than the program current value of the magnetic memory cell classified as the third magnetic memory cell group, and the program current value of the magnetic memory cell classified as the third magnetic memory cell group may be smaller than the program current value of the magnetic memory cell classified as the fourth magnetic memory cell group.

According to one embodiment, a magnetic memory cell array in which magnetic memory cells are two-dimensionally arranged may be prepared. The magnetic memory cell array may be divided into arbitrary shapes and arbitrary regions. Thereafter, in the magnetic memory cell array, sampling may be performed in the divided arbitrary regions, and a sampled magnetic memory cell may be classified into the magnetic memory cell groups based on a program current value of the sampled magnetic memory cell by the method described with reference to FIGS. 10 and 4. All of the remaining magnetic memory cells within the arbitrary region, which is subject to the sampling, may be defined as the same magnetic memory cell group as the magnetic memory cell group to which the sampled magnetic memory cell belongs. For example, when the sampled magnetic memory cell is classified as the first magnetic memory cell group, the remaining magnetic memory cells around the sampled magnetic memory cell within the arbitrary region may also be classified as the first magnetic memory cell group.

A magnetic memory system may be constructed by hierarchizing the magnetic memory cell groups (S330). The magnetic memory system may include a cache memory.

The hierarchizing of the magnetic memory cell groups may include: allocating the first magnetic memory cell group to an L1 I-cache; allocating the second magnetic memory cell group to an L1 D-cache; allocating the third magnetic memory cell group to an L2 cache; and allocating the fourth magnetic memory cell group to an L3 cache. In this case, according to one embodiment, a program current value of the first magnetic memory cell group allocated to the L1 I-cache may be defined as the first reference current value, a program current value of the second magnetic memory cell group allocated to the L1 D-cache may be defined as the second reference current value, a program current value of the third magnetic memory cell group allocated to the L2 cache may be defined as the third reference current value, and a program current value of the fourth magnetic memory cell group allocated to the L3 cache may be defined as the fourth reference current value.

An average program current value of the magnetic memory cells classified as the first magnetic memory cell group allocated to the L1 I-cache may be smaller than an average program current value of the magnetic memory cells classified as the second magnetic memory cell group allocated to the L1 D-cache, the average program current value of the magnetic memory cells classified as the second magnetic memory cell group allocated to the L1 D-cache may be smaller than an average program current value of the magnetic memory cells classified as the third magnetic memory cell group allocated to the L2 cache, and the average program current value of the magnetic memory cells classified as the third magnetic memory cell group allocated to the L2 cache may be smaller than an average program current value of the magnetic memory cells classified as the fourth magnetic memory cell group allocated to the L3 cache.

In addition, the method of constructing the magnetic memory system may include allocating the magnetic memory cells to an L1 I-cache, an L1 D-cache, an L2 cache, and an L3 cache according to magnetization reversal states of the magnetic memory cells with respect to the reference current values. In other words, a magnetic memory cell that is subject to magnetization reversal by the first reference current value may be classified as the first magnetic memory cell group so as to be allocated to the L1 I-cache. In addition, a magnetic memory cell that is subject to the magnetization reversal by the second reference current value without being subject to the magnetization reversal by the first reference current value may be classified as the second magnetic memory cell group so as to be allocated to the L1 D-cache. Further, a magnetic memory cell that is subject to the magnetization reversal by the third reference current value without being subject to the magnetization reversal by the second reference current value may be classified as the third memory cell group so as to be allocated to the L2 cache. In addition, a magnetic memory cells that is subject to the magnetization reversal by the fourth reference current value without being subject to the magnetization reversal by the third reference current value may be classified as the fourth memory cell group so as to be allocated to the L3 cache.

In accordance with the embodiment of the present disclosure, the magnetic memory cells may be classified into the magnetic memory cell groups by comparing the program current values of the magnetic memory cells, which have mutually different program current values, with the reference current values, and the magnetic memory cell groups may be hierarchized.

Unlike the above-described embodiment of the present disclosure, when a plurality of magnetic memory cells are not classified and hierarchized by using a difference in program current values, it may not be easy to construct a memory system by using the magnetic memory cells due to mutually different program current values of the magnetic memory cells. In addition, when the magnetic memory cells are manufactured on a large-area wafer, it may not be easy to manufacture the magnetic memory cells such that the magnetic memory cells have substantially the same program current value. Accordingly, it may be more difficult to construct a magnetic memory system by using the magnetic memory cells manufactured on the large-area wafer.

However, in accordance with the embodiment of the present disclosure, the magnetic memory cells may be hierarchized by using a difference in the program current values of the magnetic memory cells. Accordingly, a magnetic memory system with high efficiency and high reliability may be provided. In addition, the magnetic memory system may be easily constructed by using a plurality of magnetic memory cells, which are manufactured on a large-area wafer to have a difference in program current values.

Subsequently, referring to FIG. 10, programming may be primarily performed by selecting one magnetic memory cell group from the hierarchized magnetic memory cell groups according to an external temperature (S340).

The magnetic memory cell included in the magnetic memory system may be configured such that a coercive force varies in a high- or low-temperature environment as shown in FIG. 11, so that magnetic properties may rapidly deteriorate. As a result, reliability of the magnetic memory system may deteriorate according to a variation in the external temperature. In detail, as shown in FIG. 11, when the external temperature decreases, the coercive force may be increased, so that the program current value of the magnetic memory cell may be increased. Accordingly, when the external temperature decreases, power consumption of the magnetic memory system may be increased. On the contrary, when the external temperature increases, the coercive force may be decreased, so that the program current value of the magnetic memory cell may be decreased, but simultaneously, data of the magnetic memory cell may be lost due to a high external temperature. When the data of the magnetic memory cell is lost, a rate of performing a data recovery algorithm may be rapidly increased in order to recover the lost data, so that the power consumption of the magnetic memory system may be increased, and the reliability of the magnetic memory system may deteriorate.

Accordingly, in accordance with the embodiment of the present disclosure, the programming may be primarily performed by selecting the one magnetic memory cell group from the hierarchized magnetic memory cell groups according to the external temperature.

In detail, when the external temperature is a relatively high temperature, the programming may be primarily performed by selecting a magnetic memory cell group having a relatively high program current value, so that a loss of data programmed in the magnetic memory cell may be minimized even in a high-temperature external environment. In addition, when the external temperature is a relatively low temperature, the programming may be primarily performed by selecting a magnetic memory cell group having a relatively low program current value, so that a programming operation may be easily performed with a low program current value even in a low-temperature external environment.

When the magnetic memory cells are classified into the magnetic memory cell groups as described with reference to FIGS. 10 and 4, and the magnetic memory cell groups are hierarchized into the L1 I-cache, the L1 D-cache, the L2 cache, and the L3 cache, the external temperature may be compared with first to fourth reference temperatures to primarily select the magnetic memory cell to be programmed as shown in FIG. 12.

In detail, the primarily performing of the programming by selecting the one magnetic memory cell group according to the external temperature may include: comparing the first reference temperature with the external temperature to primarily perform the programming by selecting the L3 cache (the fourth magnetic memory cell group) when the external temperature ($T_{ex}$) is higher than the first reference temperature ($T_1$) (S410); comparing the second reference temperature ($T_2$) with the external temperature ($T_{ex}$) to primarily perform the programming by selecting the L2 cache (the third magnetic memory cell group) when the external temperature ($T_{ex}$) is higher than the second reference temperature ($T_2$) (S420); comparing the third reference temperature ($T_3$) with the external temperature ($T_{ex}$) to primarily perform the programming by selecting the L1 D-cache (the second magnetic memory cell group) when the external temperature ($T_{ex}$) is higher than the third reference temperature ($T_3$) (S430); and comparing the fourth reference temperature ($T_4$) with the external temperature ($T_{ex}$) to primarily perform the programming by selecting the L1 I-cache (the first magnetic memory cell group) when the external temperature ($T_{ex}$) is higher than the fourth reference temperature ($T_4$) (S440). In this case, the second reference temperature ($T_2$) may be lower than the first reference temperature ($T_1$), the third reference temperature ($T_3$) may be lower than the second reference temperature ($T_2$), and the fourth reference temperature ($T_4$) may be lower than the third reference temperature ($T_3$).

In other words, as the external temperature increases, the programming may be primarily performed by sequentially selecting the L3 cache, the L2 cache, the L1 D-cache, and the L1 I-cache, which are in order of the program current value from the highest to the lowest.

In accordance with the embodiment of the present disclosure, the hierarchized magnetic memory system may be constructed by classifying the magnetic memory cells into the magnetic memory cell groups by using the program current values of the magnetic memory cells, and the programming may be primarily performed by selecting the one magnetic memory cell group from the hierarchized magnetic memory cell groups according to the external temperature.

Accordingly, in the low-temperature environment, the power consumption may be prevented from being increased by an increase in a program current caused by an increase in the coercive force during a program operation, and in the high-temperature environment, the loss of the data stored in the magnetic memory cell may be minimized, so that the rate of performing the data recovery algorithm may be prevented from being increased. Therefore, a magnetic memory system that is stably driven in various external environments and a method of operating the magnetic memory system may be provided.

According to one modified example, an algorithm for selecting the magnetic memory cell group on which the programming is to be primarily performed according to the external temperature described with reference to FIG. 12 may be executed at a predetermined period without being always executed before all programming operations. In other words, when the algorithm for selecting the magnetic memory cell group on which the programming is to be primarily performed according to the external temperature is executed, the programming operation may be performed according to the algorithm that is primarily executed until the algorithm for selecting the magnetic memory cell group is secondarily executed.

Alternatively, according to another modified example, the algorithm for selecting the magnetic memory cell group on which the programming is to be primarily performed according to the external temperature described with reference to FIG. 12 may be executed when the external temperature fluctuates beyond a reference range without being always executed before all programming operations.

Accordingly, the algorithm for selecting the magnetic memory cell group on which the programming is to be primarily performed according to the external temperature may be restrictively executed, so that the programming operation may be rapidly performed, and the power consumption may be prevented from being excessively increased.

FIG. 13 is a block diagram for describing an electronic element including the magnetic memory system according to the second embodiment of the present disclosure, and FIG. 14 is a block diagram for describing a control unit included in the magnetic memory system according to the second embodiment of the present disclosure.

Referring to FIGS. 13 and 14, an electronic element including a CPU 610, a first magnetic memory cell group 620, a second magnetic memory cell group 630, a third magnetic memory cell group 640, an external DRAM 650, an external flash memory 660, an HDD 670, a control unit 700, and a temperature sensor 800 may be prepared. The first to third magnetic memory cell groups 620 to 640 may be magnetic memory cell groups to which a plurality of magnetic memory cells are classified and allocated by the method described with reference to FIGS. 10 and 4. A program current value of a magnetic memory cell classified as the first magnetic memory cell group 620 may be smaller than a program current value of a magnetic memory cell classified as the second magnetic memory cell group 630, and the program current value of the magnetic memory cell classified as the second magnetic memory cell group 630 may be smaller than a program current value of a magnetic memory cell classified as the third magnetic memory cell group 640.

The temperature sensor 800 may measure an external temperature, and may transmit external temperature information to the control unit 700 by using an analog-to-digital converter (ADC) and a signal processing unit based on the measured external temperature.

The control unit 700 may classify data of the user, and may determine a storage location of the data according to characteristics of the classified data.

In addition, the control unit 700 may control the primarily performing of the programming by selecting one of the magnetic memory cell groups 620, 630, and 640 according to the external temperature. In detail, as described with reference to FIG. 12, when the external temperature is relatively high, the programming may be primarily performed by selecting the third magnetic memory cell group 640 having a relatively high program current value. On the contrary, when the external temperature is relatively low, the programming may be primarily performed by selecting the first magnetic memory cell group 620 having a relatively low program current value.

The control unit 700 may include an analysis unit 710, a classification unit 720, a storage unit 730, and an internal processing unit 740.

The analysis unit 710 may receive the external temperature information from the temperature sensor 800 to analyze the external temperature. The classification unit 720 may classify usage data of the user based on scenario data of the user by comparing the external temperature with the first to fourth reference temperatures as described with reference to FIG. 12. The storage unit 730 may store the classified data for each data class. The internal processing unit 740 may include an internal memory for classifying and storing the data, and may control the analysis unit 710, the classification unit 720, and the storage unit 730.

Although the exemplary embodiments of the present disclosure have been described in detail, the scope of the present disclosure is not limited to a specific embodiment, and should be interpreted by the appended claims. In addition, it should be understood by those of ordinary skill in the art that various changes and modifications can be made without departing from the scope of the present disclosure.

What is claimed is:

1. A method of operating a magnetic memory system, the method comprising:
   preparing a plurality of magnetic memory cells;
   classifying the magnetic memory cells into a plurality of magnetic memory cell groups by using program current values of the magnetic memory cells;
   constructing a magnetic memory system by hierarchizing the magnetic memory cell groups; and
   primarily performing programming by selecting one magnetic memory cell group from the hierarchized magnetic memory cell groups according to an external temperature
   wherein the classifying of the magnetic memory cells into the magnetic memory cell groups includes:
      classifying a magnetic memory cell, which has a program current value smaller than a first reference current value, as a first magnetic memory cell group by comparing the first reference current value with a program current value of the magnetic memory cell;
      classifying a magnetic memory cell, which has a program current value smaller than a second reference current value, as a second magnetic memory cell group by comparing the second reference current value, which is greater than the first reference current value, with the program current value of the magnetic memory cell;
      classifying a magnetic memory cell, which has a program current value smaller than a third reference current value, as a third magnetic memory cell group by comparing the third reference current value, which is greater than the second reference current value, with the program current value of the magnetic memory cell; and
      classifying a magnetic memory cell, which has a program current value smaller than a fourth reference current value, as a fourth magnetic memory cell group by comparing the fourth reference current value, which is greater than the third reference current value, with the program current value of the magnetic memory cell.

2. The method of claim 1, wherein the magnetic memory cell groups include:
   a first magnetic memory cell group having a relatively low program current value; and
   a second magnetic memory cell group having a relatively high program current value.

3. The method of claim 2, wherein the performing of the programming includes:
   primarily performing the programming on the second magnetic memory cell group when the external temperature is higher than a reference temperature; and
   primarily performing the programming on the first magnetic memory cell group when the external temperature is lower than the reference temperature.

4. The method of claim 1, wherein the magnetic memory cells are spin transfer torque-magnetic random access memories (STT-MRAMs).

5. The method of claim 1, wherein the constructing of the magnetic memory system by hierarchizing the magnetic memory cell groups includes:
   allocating the first magnetic memory cell group to an L1 I-cache;
   allocating the second magnetic memory cell group to an L1 D-cache;
   allocating the third magnetic memory cell group to an L2 cache; and
   allocating the fourth magnetic memory cell group to an L3 cache.

6. The method of claim 5, wherein the primarily performing of the programming by selecting the one magnetic memory cell group according to the external temperature includes:
   comparing a first reference temperature with the external temperature to primarily perform the programming by selecting the L3 cache when the external temperature is higher than the first reference temperature;
   comparing a second reference temperature, which is lower than the first reference temperature, with the external temperature to primarily perform the programming by selecting the L2 cache when the external temperature is higher than the second reference temperature;
   comparing a third reference temperature, which is lower than the second reference temperature, with the external temperature to primarily perform the programming by selecting the L1 D-cache when the external temperature is higher than the third reference temperature; and
   comparing a fourth reference temperature, which is lower than the third reference temperature, with the external temperature to primarily perform the programming by selecting the L1 I-cache when the external temperature is higher than the fourth reference temperature.

7. A magnetic memory system comprising:
   a temperature sensor configured to measure an external temperature;
   a first magnetic memory cell group having a first program current value;
   a second magnetic memory cell group having a second program current value that is higher than the first program current value; and
   a control unit configured to primarily perform programming by selecting one of the first magnetic memory cell group or the second magnetic memory cell group according to the external temperature measured by the temperature sensor,
   wherein an average program current value of the magnetic memory cells included in the first magnetic memory cell group is smaller than an average program current value of the magnetic memory cells included in the second magnetic memory cell group.

8. The magnetic memory system of claim 7, wherein the control unit is configured to:
   primarily perform the programming on the second magnetic memory cell group when the external temperature is higher than a reference temperature; and
   primarily perform the programming on the first magnetic memory cell group when the external temperature is lower than the reference temperature.

9. The magnetic memory system of claim 7, wherein the first magnetic memory cell group and the second magnetic memory cell group constitute a cache memory.

10. The magnetic memory system of claim 9, wherein, in the cache memory, the first magnetic memory cell group belongs to a higher hierarchy as compared with the second magnetic memory cell group.

11. A method of constructing a magnetic memory system, the method comprising:
   preparing a plurality of magnetic memory cells;
   classifying the magnetic memory cells into a plurality of magnetic memory cell groups by comparing a plurality of reference current values with program current values of the magnetic memory cells; and
   constructing a magnetic memory system by hierarchizing the magnetic memory cell groups,
   wherein the classifying of the magnetic memory cells into the magnetic memory cell groups includes:
      classifying a magnetic memory cell, which has a program current value smaller than a first reference current value, as a first magnetic memory cell group by comparing the first reference current value with a program current value of the magnetic memory cell;
      classifying a magnetic memory cell, which has a program current value smaller than a second reference current value, as a second magnetic memory cell group by comparing the second reference current value, which is greater than the first reference current value, with the program current value of the magnetic memory cell;
      classifying a magnetic memory cell, which has a program current value smaller than a third reference current value, as a third magnetic memory cell group by comparing the third reference current value, which is greater than the second reference current value, with the program current value of the magnetic memory cell; and
      classifying a magnetic memory cell, which has a program current value smaller than a fourth reference current value, as a fourth magnetic memory cell group by comparing the fourth reference current value, which is greater than the third reference current value, with the program current value of the magnetic memory cell.

12. The method of claim 11, wherein the magnetic memory cells are spin transfer torque-magnetic random access memories (STT-MRAMs).

13. The method of claim 11, wherein the magnetic memory system includes a cache memory.

14. The method of claim 11, wherein the constructing of the magnetic memory system by hierarchizing the magnetic memory cell groups includes:

allocating the first magnetic memory cell group to an L1 I-cache;

allocating the second magnetic memory cell group to an L1 D-cache;

allocating the third magnetic memory cell group to an L2 cache; and allocating the fourth magnetic memory cell group to an L3 cache.

15. The method of claim 14, wherein a program current value of the first magnetic memory cell group allocated to the L1 I-cache is defined as the first reference current value, a program current value of the second magnetic memory cell group allocated to the L1 D-cache is defined as the second reference current value, a program current value of the third magnetic memory cell group allocated to the L2 cache is defined as the third reference current value, and a program current value of the fourth magnetic memory cell group allocated to the L3 cache is defined as the fourth reference current value.

16. The method of claim 14, wherein an average program current value of the magnetic memory cells classified as the first magnetic memory cell group allocated to the L1 I-cache is smaller than an average program current value of the magnetic memory cells classified as the second magnetic memory cell group allocated to the L1 D-cache, the average program current value of the magnetic memory cells classified as the second magnetic memory cell group allocated to the L1 D-cache is smaller than an average program current value of the magnetic memory cells classified as the third magnetic memory cell group allocated to the L2 cache, and the average program current value of the magnetic memory cells classified as the third magnetic memory cell group allocated to the L2 cache is smaller than an average program current value of the magnetic memory cells classified as the fourth magnetic memory cell group allocated to the L3 cache.

* * * * *